United States Patent
Kim

(10) Patent No.: US 7,585,780 B2
(45) Date of Patent: Sep. 8, 2009

(54) METHOD FOR MANUFACTURING SEMICONDUCTOR DEVICE

(75) Inventor: Jong Kuk Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/771,573

(22) Filed: Jun. 29, 2007

(65) Prior Publication Data

US 2008/0153247 A1 Jun. 26, 2008

(30) Foreign Application Priority Data

Dec. 26, 2006 (KR) .................... 10-2006-0134073

(51) Int. Cl.
*H01L 21/302* (2006.01)
*H01L 21/461* (2006.01)

(52) U.S. Cl. .................. 438/725; 438/706; 438/710; 257/E21.486

(58) Field of Classification Search ........... 438/706, 438/710, 725; 257/E21.486
See application file for complete search history.

(56) References Cited

U.S. PATENT DOCUMENTS

| | | | |
|---|---|---|---|
| 6,358,849 B1* | 3/2002 | Havemann et al. | 438/689 |
| 6,554,004 B1* | 4/2003 | Nguyen et al. | 134/1.3 |
| 6,649,531 B2* | 11/2003 | Cote et al. | 438/714 |
| 7,368,394 B2* | 5/2008 | Shen et al. | 438/722 |
| 2002/0072230 A1* | 6/2002 | Li | 438/677 |
| 2003/0100190 A1* | 5/2003 | Cote et al. | 438/710 |
| 2003/0143840 A1* | 7/2003 | Li | 438/637 |
| 2003/0216052 A1* | 11/2003 | Kakamu | 438/725 |
| 2004/0097077 A1* | 5/2004 | Nallan et al. | 438/689 |
| 2005/0153538 A1* | 7/2005 | Tsai et al. | 438/636 |
| 2005/0287815 A1* | 12/2005 | Lai et al. | 438/710 |
| 2006/0068592 A1* | 3/2006 | Dostalik | 438/706 |
| 2006/0211216 A1* | 9/2006 | Sandhu et al. | 438/445 |
| 2007/0042598 A1* | 2/2007 | Park | 438/634 |

(Continued)

FOREIGN PATENT DOCUMENTS

KR 10-1998-0005527 3/1998

OTHER PUBLICATIONS

Translation of Notice of Rejection for corresponding Korean Application No. 10-2006-0134073, dated May 27, 2008.

*Primary Examiner*—George Fourson
*Assistant Examiner*—John M Parker
(74) *Attorney, Agent, or Firm*—Marshall Gerstein & Borun LLP

(57) ABSTRACT

A method for manufacturing a semiconductor device comprises: forming an interlayer insulating film including a storage node contact plug over a semiconductor substrate; forming an etching barrier film, a sacrificial insulating film, and a hard mask film over the storage node contact plug and the interlayer insulating film; forming a first storage node region by removing a portion of the sacrificial insulating film and the hard mask film by an etching process such that a polymer film is formed at a sidewall of the hard mask film and the sacrificial insulating film; and forming a second storage node region by removing the remaining portions of the sacrificial insulating film and the etching barrier film, thereby exposing the storage node contact plug. The method prevents a bowing phenomenon in the etching process for forming a storage node region and thus allows storage nodes having substantially vertical profiles to be formed.

14 Claims, 4 Drawing Sheets

U.S. PATENT DOCUMENTS

| | | | |
|---|---|---|---|
| 2007/0186953 A1* | 8/2007 | Savas et al. | 134/1.3 |
| 2007/0191243 A1* | 8/2007 | Moore | 510/175 |
| 2007/0193602 A1* | 8/2007 | Savas et al. | 134/1.1 |
| 2007/0202700 A1* | 8/2007 | Leucke et al. | 438/689 |
| 2008/0093338 A1* | 4/2008 | Okune et al. | 216/41 |
| 2008/0132067 A1* | 6/2008 | Ma | 438/674 |
| 2008/0138924 A1* | 6/2008 | Park et al. | 438/52 |

* cited by examiner

METHOD FOR MANUFACTURING SEMICONDUCTOR DEVICE

CROSS-REFERENCE TO RELATED APPLICATION

The present application claims the priority benefit of Korean patent application number 10-2006-0134073, filed on Dec. 26, 2006, which is incorporated herein by reference in its entirety.

BACKGROUND OF THE INVENTION

The present invention generally relates to a method for manufacturing a semiconductor device, and more specifically, to a method for forming a capacitor of a semiconductor device.

Recently, a DRAM device of high capacity has been used as a semiconductor memory device. The DRAM device comprises a transistor and a capacitor. The DRAM device includes a memory cell region for storing data with charges and a peripheral circuit region for inputting and outputting data.

However, it is difficult to provide capacitance of the capacitor as the design rule is smaller due to high integration of the memory device.

As a result, a lower electrode of the capacitor is configured to have a three-dimensional structure such as a cylinder structure and a concave structure.

In the cylinder structure, a storage node region is formed, and a Titanium Nitride (TiN) film is deposited in the storage node region to form the lower electrode. A full dip-out process is performed to remove an oxide film. A dielectric film and an upper electrode are formed.

However, the integration of the memory device has been increased, so that a width of the electrode becomes smaller and a height of the electrode becomes higher.

When an etching process is performed to form a storage node region, a lateral etching process causes a bowing phenomenon where the middle of the storage node region becomes wider than the top of the storage node region.

A minimum bar critical dimension which is a distance between the neighboring storage nodes is smaller because of the bowing phenomenon, which results in bridges.

Although the minimum bar critical dimension is increased to prevent bridges, a margin lacks in the etching process for forming a storage node region to generate a not-open phenomenon.

Although an etching characteristic has been strengthened, the bowing phenomenon occurs so that the minimum bar critical dimension is decreased.

BRIEF SUMMARY OF THE INVENTION

Various embodiments of the present invention are directed to providing a method for manufacturing a semiconductor device which prevents a bowing phenomenon in an etching process for forming a storage node region.

A method for manufacturing a semiconductor device comprises: forming an interlayer insulating film including a storage node contact plug over a semiconductor substrate; forming an etching barrier film, a sacrificial insulating film, and a hard mask film over the storage node contact plug and the interlayer insulating film; forming a first storage node region by selectively removing portions of the sacrificial insulating film and the hard mask film by an etching process such that etching residuals including a polymer are formed at a sidewall of the first storage node contact hole; and forming a second storage node region by selectively removing the remaining portions of the sacrificial insulating film and the etching barrier film by an etching process, thereby exposing the storage node contact plug.

DETAILED DESCRIPTION OF THE EXEMPLARY EMBODIMENTS

Figure 1A:
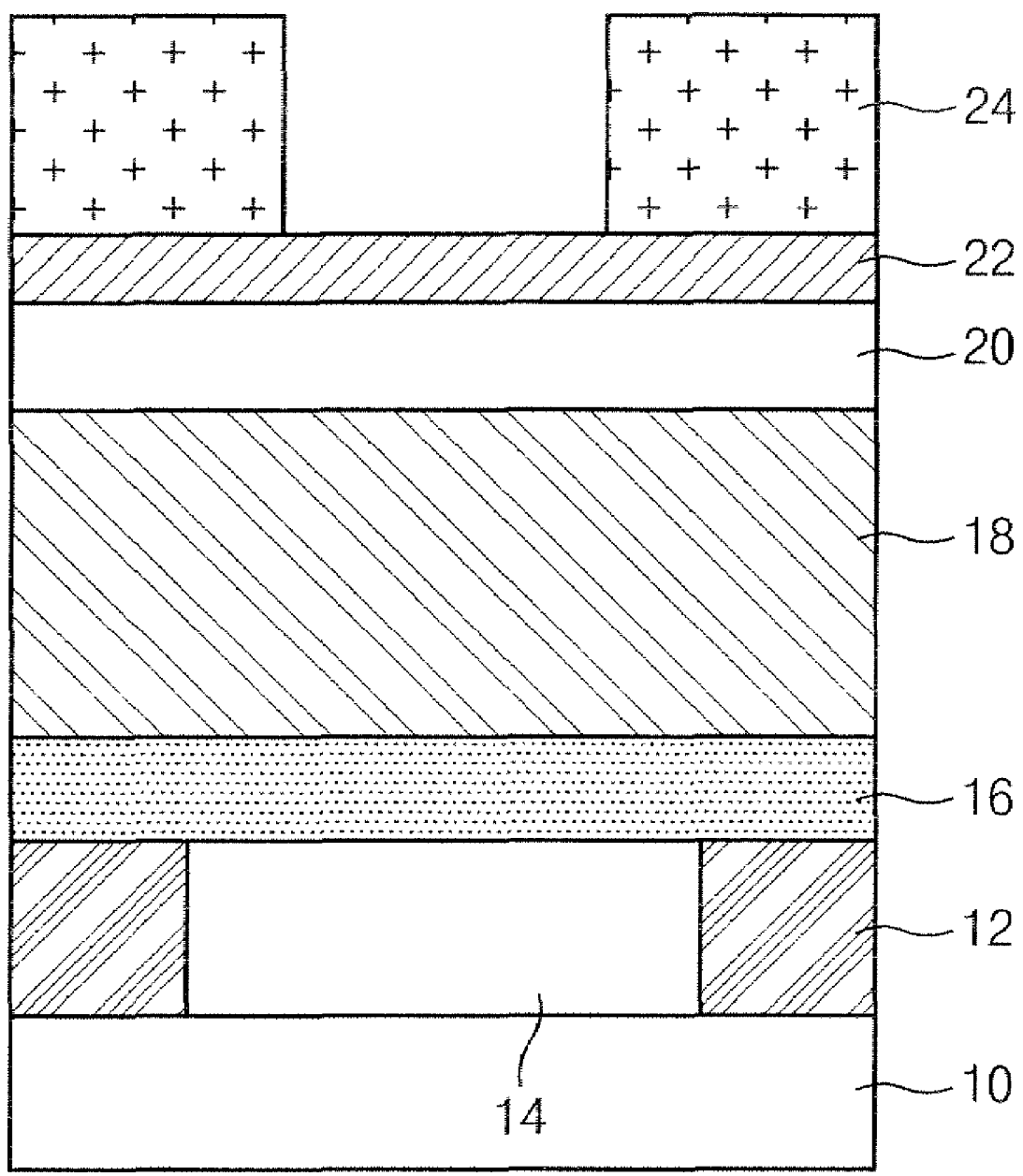
FIGS. 1a through 1d are cross-sectional diagrams illustrating a method for manufacturing a semiconductor device according to an embodiment of the present invention.

The present invention will be described in detail with reference to the accompanying drawings.

FIGS. 1a through 1d are cross-sectional diagrams illustrating a method for manufacturing a semiconductor device according to an embodiment of the present invention. A device isolation film (not shown) which defines an active region is formed over a semiconductor substrate 10. A gate is formed over the semiconductor substrate 10, and a landing plug is formed which is connected to a bit line contact and a storage node contact region. A first interlayer insulating film is formed over the resulting structure. The first interlayer insulating film is etched by a photo-etching process with a bit line contact mask to form a bit line contact hole.

A conductive film is filled in the bit line contact hole to form a bit line contact plug. A bit line is formed over the bit line contact plug, and a second interlayer insulating film 12 is formed which covers the bit line. A first photoresist film is formed over the second interlayer insulating film 12. The first photoresist film is exposed and developed with a storage node contact mask to form a first photoresist pattern. The second interlayer insulating film 12 is etched with the first photoresist pattern to form a storage node contact hole. The first photoresist pattern is removed. A conductive film is filled in the storage node contact hole to form a storage node contact plug 14.

An etching barrier film 16 is formed over the second interlayer insulating film 12 including the storage node contact plug 14. The etching barrier film 16 generally comprises a nitride film. A sacrificial insulating film 18, a first hard mask film 20, and a second hard mask film 22 are sequentially formed over the etching barrier film 16. The sacrificial insulating film 18 is typically formed to have a thickness ranging from about 10000 Å to about 30000 Å. The first hard mask film 20 generally comprises an amorphous carbon layer, and the second hard mask film 22 generally comprises a nitride film. A second photoresist film is formed over the second hard mask film 22. The second photoresist film is etched with a storage node mask to form a second photoresist pattern 24.

Figure 1B:
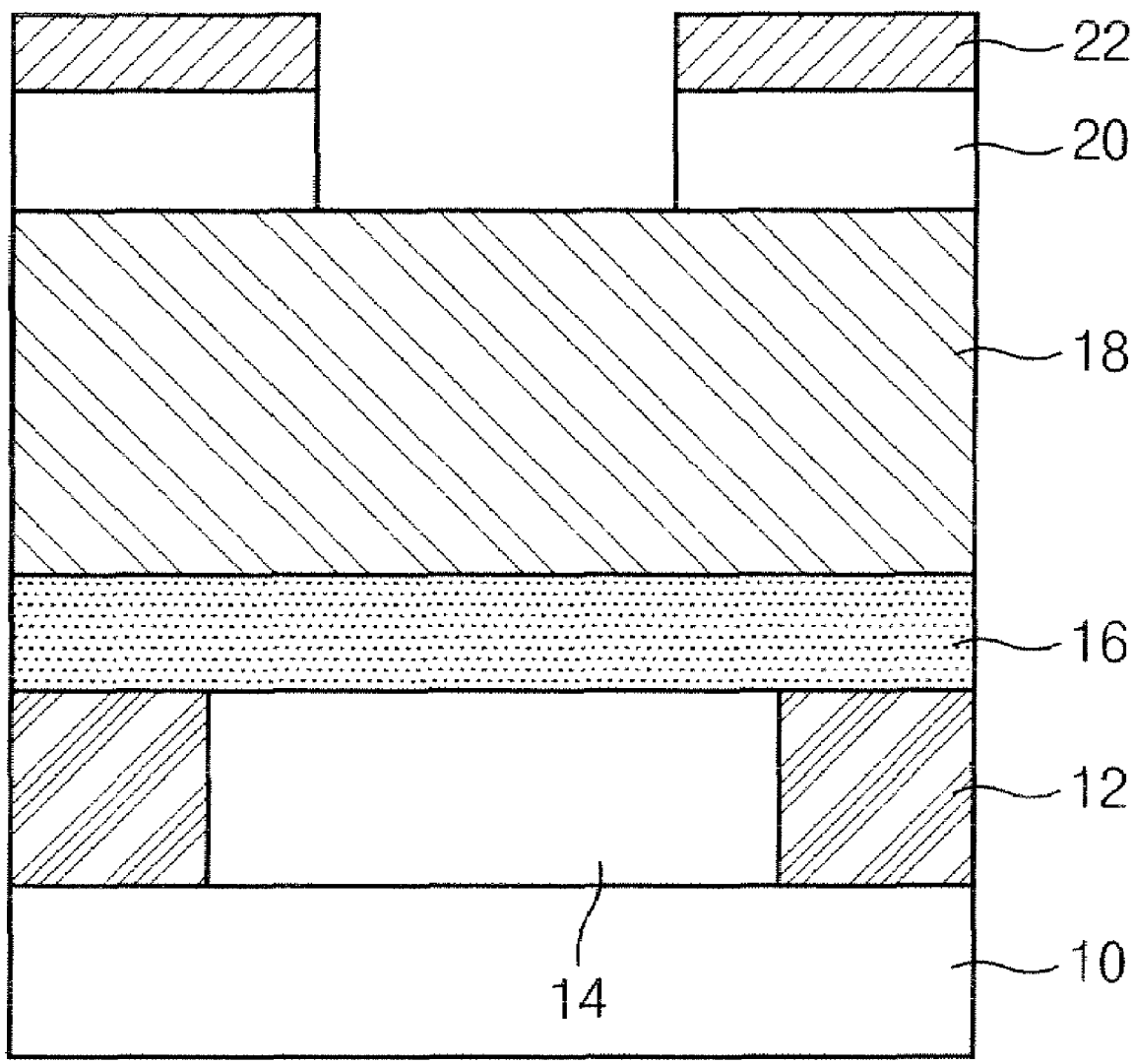

Referring to FIG. 1b, the second hard mask film 22 and the first hard mask film 20 are etched with the second photoresist pattern 24 as a mask to expose the sacrificial insulating film 18.

Figure 1C:
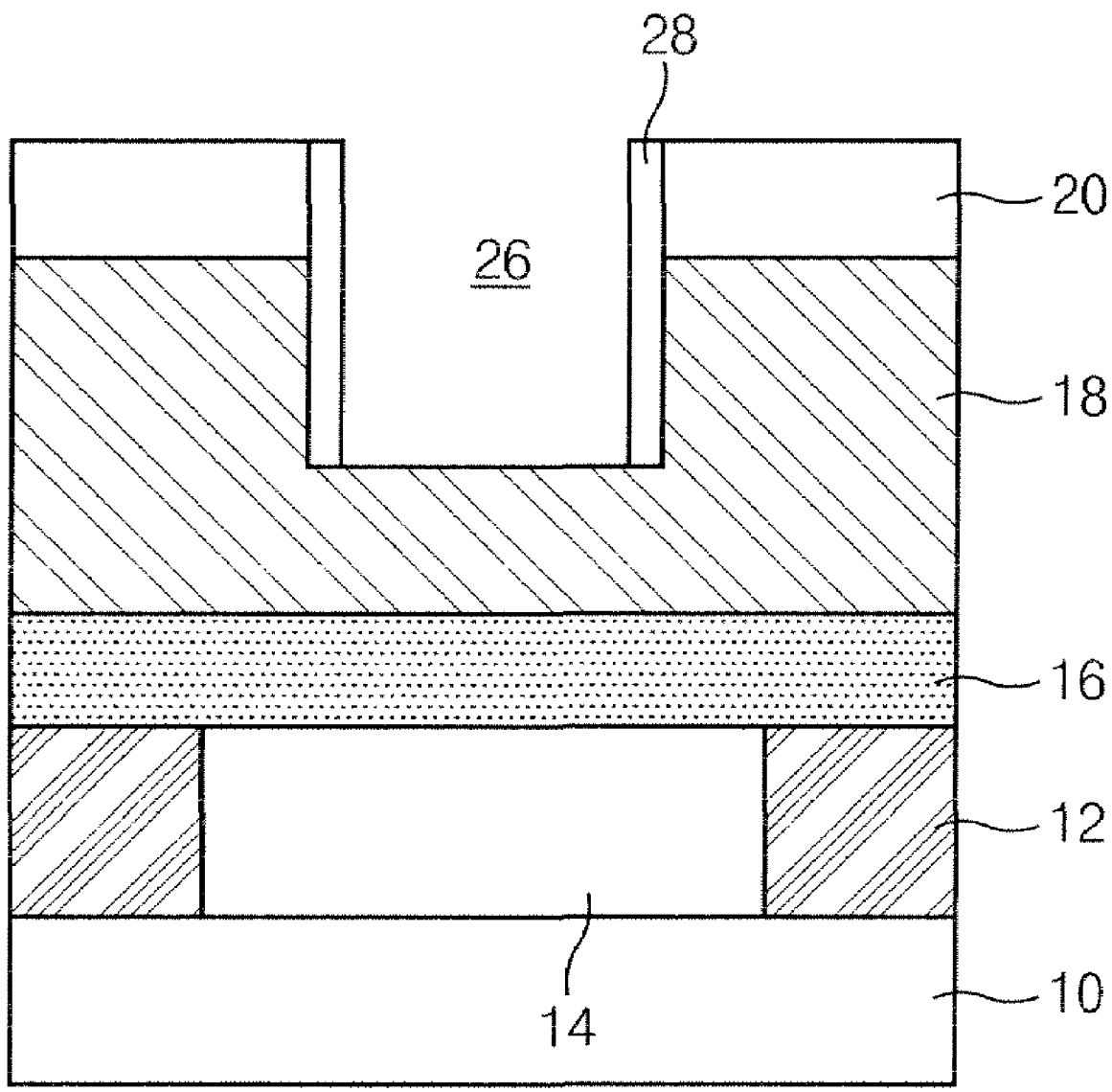

Referring to FIG. 1c, the second photoresist pattern 24 is removed. When the second photoresist pattern 24 is removed, the second hard mask film 22 is also removed. The sacrificial insulating film 18 is etched at a given thickness with the first hard mask film 20 as a mask, to form a first storage node region 26. The etching process for forming the first storage node region 26 is performed to form an etching residual, that is, a polymer 28, for protecting the inner wall of the first storage node region 26 in a subsequent etching process for forming a second storage node region 30. The etching process is performed under a pressure in a range of about 10 to about 100 milli Torr (mT), with a main etch gas selected from the group consisting of F, Ar, O, and combinations thereof, and with an assistant gas selected from the group consisting of $H_2$, Ar, fluoro carbon, hydrofluoro carbon, and combinations thereof. The assistant gas has a flow amount in a range of about 10 to about 100 standard cubic centimeters per minute (sccm). An etching target of the sacrificial insulating film 18 ranges from about 500 Å to about 5000 Å. Accordingly, the polymer 28, for example a silicon carbon layer is formed at a sidewall of the first hard mask film 20 and the sacrificial insulating film 18 during the etching process for forming the first storage node region 26 under the above-described conditions.

Figure 1D:
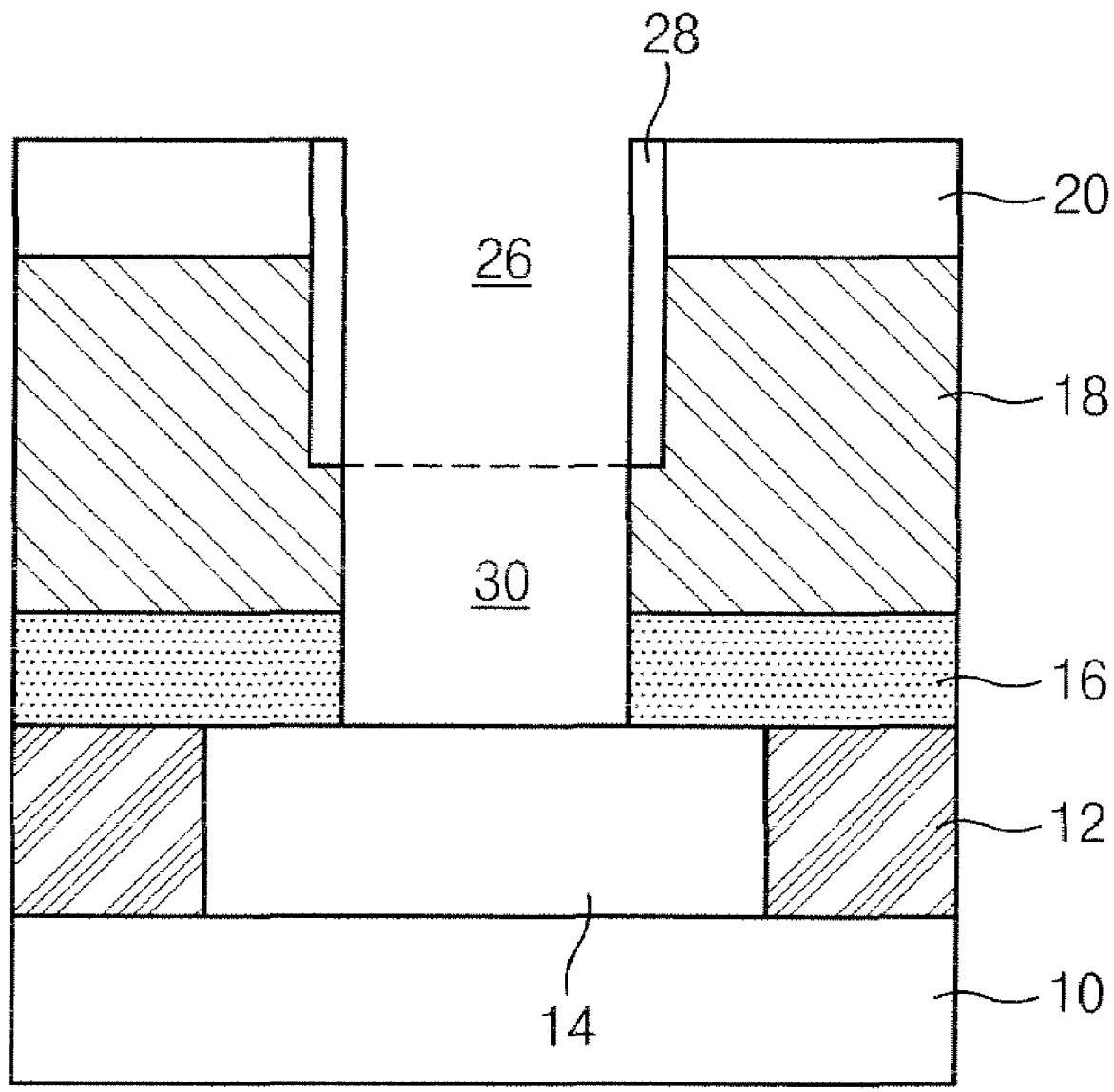

Referring to FIG. 1d, the sacrificial insulating film 18 and the etching barrier film 16 are etched with the first hard mask film 20 as a mask to form a second storage node region 30. The etching process for forming a second storage node region 30 is performed by one of an in situ method and an ex situ method. The first hard mask film 20 and the polymer 28 are removed to form a storage node region including the first storage node region 26 and the second storage node region 30. A storage node is formed at a sidewall of the storage node region. A dielectric film and an upper electrode are formed over the storage node to form a capacitor.

As described above, in a method for manufacturing a semiconductor device according to an embodiment of the present invention, a polymer is formed over a storage node to prevent a lateral etch and a bowing phenomenon in an etching process, thereby obtaining a vertical profile. Also, the method secures a minimum bar critical dimension which is a distance between the neighboring storage nodes, thereby preventing bridges.

The above embodiments of the present invention are merely illustrative and are not intended to limit the scope of the appended claims as various alternatives and equivalents are within the skill of the ordinary artisan. Thus, the invention is not limited by the lithography steps described herein. Nor is the invention limited to any specific type of semiconductor device. For example, the present invention may be implemented in a dynamic random access memory (DRAM) devices and non volatile memory devices. Other additions, subtractions, or modifications that are obvious in view of the present disclosure are also intended to fall within the scope of the appended claims.

What is claimed is:

1. A method for manufacturing a semiconductor device, the method comprising:
    forming an interlayer insulating film including a storage node contact plug over a semiconductor substrate;
    forming an etching barrier film, a sacrificial insulating film, and a hard mask film over the storage node contact plug and the interlayer insulating film, wherein the hard mask film has a stacked structure including first and second hard mask films;
    forming a first storage node region by selectively removing portions of the sacrificial insulating film and the hard mask film by an etching process such that etching residuals including a polymer are formed at a sidewall of the first storage node region;
    forming a second storage node region by selectively removing the remaining portions of the sacrificial insulating film and the etching barrier film by an etching process, thereby exposing the storage node contact plug; and,
    forming a dielectric film and an upper electrode over the first and second storage node regions,
    wherein forming the first storage node region step comprises:
        forming a photoresist film over the second hard mask film;
        exposing and developing the photoresist film with a storage node mask to form a photoresist pattern;
        etching the first and second hard mask films with the photoresist pattern as a mask to expose the sacrificial insulating film;
        removing the photoresist pattern and the second hard mask film; and
        removing a portion of the sacrificial insulating film with the first hard mask film to form the first storage node region.

2. The method according to claim 1, wherein the sacrificial insulating film has a thickness ranging from about 10000 Å to about 30000 Å.

3. The method according to claim 1, wherein the first hard mask film comprises an amorphous carbon layer, and the second hard mask film comprises a nitride film.

4. The method according to claim 1, wherein the etching process in the forming-a-first-storage-node-region step is performed under a pressure in a range of about 10 to about 100 milli Torr, with a main etch gas selected from the group consisting of F, Ar, O, and combinations thereof, and with an assistant gas selected from the group consisting of $H_2$, Ar, fluoro carbon, hydrofluoro carbon, and combinations thereof.

5. The method according to claim 4, wherein the assistant gas has a flow amount in a range of about 10 to about 100 standard cubic centimeters per minute.

6. The method according to claim 1, wherein an etching depth of the sacrificial insulating film in the forming-a-first-storage-node-region step ranges from about 500 Å to about 5000 Å.

7. The method according to claim 1, wherein the etching process in the forming-a-second-storage-node-region step is performed by one of an in situ method and an ex situ method.

8. A method of manufacturing a semiconductor device, the method comprising:
    forming an interlayer insulating film including a storage node contact plug over a semiconductor substrate;
    forming an etching barrier film, a sacrificial insulating film, and a hard mask film over the storage node contact plug and interlayer insulating film, wherein the hard mask film has a stacked structure including first and second hard mask films;
    forming a first storage node region by selectively removing portions of the sacrificial insulating film and the hard mask film by an etching process such that etching residuals including a polymer are formed at a side wall of the first storage node region; and
    forming a second storage node region by selectively removing the remaining portions of the sacrificial insulating film and the etching barrier film by an etching process, thereby exposing the storage node contact plug,
    wherein forming the first storage node region comprises:
        forming a photoresist film over the second hard mask film;
        exposing and developing the photoresist film with a storage node mask to form a photoresist pattern;
        etching the first and second hard mask films with the photoresist pattern as a mask to expose the sacrificial insulating film;
        removing the photoresist pattern and the second hard mask film; and
        removing a portion of the sacrificial insulating film with the first hard mask film to form the first storage node region.

9. The method according to claim 8, wherein the sacrificial insulating film has a thickness ranging from about 10000 Å to about 30000 Å.

10. The method according to claim 8, wherein the first hard mask film comprises an amorphous carbon layer, and the second hard mask film comprises a nitride film.

11. The method according to claim 8, wherein the etching process in the forming-a-first-storage-node-region step is performed under a pressure in a range of about 10 to about 100 milli Torr, with a main etch gas selected from the group consisting of F, Ar, O, and combinations thereof, and with an assistant gas selected from the group consisting of $H_2$, Ar, fluoro carbon, hydrofluoro carbon, and combinations thereof.

12. The method according to claim 11, wherein the assistant gas has a flow amount in a range of about 10 to about 100 standard cubic centimeters per minute.

13. The method according to claim 8, wherein an etching depth of the sacrificial insulating film in the forming-a-first-storage-node-region step ranges from about 500 Å to about 5000 Å.

14. The method according to claim 8, wherein the etching process in the forming-a-second-storage-node-region step is performed by one of an in situ method and an ex situ method.

* * * * *